United States Patent
Park et al.

(10) Patent No.: US 10,943,840 B2
(45) Date of Patent: Mar. 9, 2021

(54) DISPLAY DEVICE INCLUDING AN ADHESIVE LAYER

(71) Applicant: SAMSUNG DISPLAY CO., LTD., Yongin-si (KR)

(72) Inventors: Eunhye Park, Asan-si (KR); Hyangyul Kim, Hwaseong-si (KR); Hyoungjoon Kim, Cheonan-si (KR); Joohyung Lee, Yongin-si (KR)

(73) Assignee: SAMSUNG DISPLAY CO, LTD., Yongin-si (KR)

( * ) Notice: Subject to any disclaimer, the term of this patent is extended or adjusted under 35 U.S.C. 154(b) by 0 days.

(21) Appl. No.: 16/676,884

(22) Filed: Nov. 7, 2019

(65) Prior Publication Data
US 2020/0144137 A1    May 7, 2020

Related U.S. Application Data

(62) Division of application No. 15/717,030, filed on Sep. 27, 2017, now Pat. No. 10,510,627.

(30) Foreign Application Priority Data

Sep. 27, 2016   (KR) .......................... 10-2016-0124137

(51) Int. Cl.
| | |
|---|---|
| *H01L 21/66* | (2006.01) |
| *G02F 1/13* | (2006.01) |
| *G02F 1/1362* | (2006.01) |
| *H01L 27/12* | (2006.01) |
| *H01L 27/32* | (2006.01) |

(Continued)

(52) U.S. Cl.
CPC ............ *H01L 22/30* (2013.01); *G02F 1/1309* (2013.01); *G02F 1/136286* (2013.01);
(Continued)

(58) Field of Classification Search
CPC ..... H01L 22/30; H01L 27/124; H01L 27/323; H01L 51/5237; H01L 27/3272; H01L 27/3276; G02F 1/1309; G02F 1/133308; G02F 1/13338; G02F 1/133512; G02F 1/136286; G02F 2001/133331;
(Continued)

(56) References Cited

U.S. PATENT DOCUMENTS

| | | | |
|---|---|---|---|
| 2010/0002180 A1* | 1/2010 | Kim .................... | G02F 1/13452 349/143 |
| 2011/0199348 A1 | 8/2011 | Takatani et al. | |

(Continued)

FOREIGN PATENT DOCUMENTS

| | | |
|---|---|---|
| JP | 2005-234090 | 9/2005 |
| KR | 10-2015-0096533 | 8/2015 |

(Continued)

*Primary Examiner* — Nathanael R Briggs
(74) *Attorney, Agent, or Firm* — F. Chau & Associates, LLC

(57) ABSTRACT

A display device includes a display panel having a display area and a non-display area. A window is disposed on the display panel. A bezel portion is disposed on the window. The bezel portion at least partially overlaps the non-display area. An adhesive layer is disposed between the display panel and the window. An interlayer is disposed between the bezel portion and the adhesive layer. The interlayer has at least one ultrasound transmitting area overlapping the bezel portion.

9 Claims, 13 Drawing Sheets

(51) Int. Cl.
*H01L 51/52* (2006.01)
*G02F 1/1333* (2006.01)
*G02F 1/1335* (2006.01)

(52) U.S. Cl.
CPC .......... *H01L 27/124* (2013.01); *H01L 27/323* (2013.01); *H01L 51/5237* (2013.01); *G02F 1/13338* (2013.01); *G02F 1/133308* (2013.01); *G02F 1/133512* (2013.01); *G02F 2001/133331* (2013.01); *G02F 2202/023* (2013.01); *G02F 2202/28* (2013.01); *G02F 2203/69* (2013.01); *H01L 27/3272* (2013.01); *H01L 27/3276* (2013.01)

(58) Field of Classification Search
CPC .......... G02F 2202/023; G02F 2202/028; G02F 2202/28; G02F 2203/69
See application file for complete search history.

(56) References Cited

U.S. PATENT DOCUMENTS

| | | | |
|---|---|---|---|
| 2015/0049287 | A1* | 2/2015 | Chang ............... G02F 1/133512 349/110 |
| 2015/0346881 | A1 | 12/2015 | Watazu |
| 2016/0098109 | A1 | 4/2016 | Choi et al. |
| 2016/0111040 | A1 | 4/2016 | Kim et al. |
| 2016/0111677 | A1 | 4/2016 | Hong et al. |
| 2018/0090398 | A1 | 3/2018 | Park et al. |
| 2018/0374422 | A1* | 12/2018 | Fujikawa .............. G02F 1/1362 |

FOREIGN PATENT DOCUMENTS

| | | |
|---|---|---|
| KR | 10-2016-0008307 | 1/2016 |
| KR | 10-2016-0039765 | 4/2016 |
| KR | 10-2016-0046073 | 4/2016 |

* cited by examiner

DISPLAY DEVICE INCLUDING AN ADHESIVE LAYER

CROSS-REFERENCE TO RELATED APPLICATION

This application is a Division of co-pending U.S. patent application Ser. No. 15/717,030, filed on Sep. 27, 2017, which claims priority to Korean Patent Application No. 10-2016-0124137, filed on Sep. 27, 2016, the content of which are herein incorporated by reference in their entirety.

TECHNICAL FIELD

Exemplary embodiments of the present invention relate to a display device, and more particularly, to a display device including an adhesive layer.

DISCUSSION OF THE RELATED ART

Modern display devices such as a liquid crystal display ("LCD") devices, organic light emitting diode ("OLED") display devices, plasma display panel ("PDP") devices, and an electrophoretic display devices, are commonly referred to as flat panel displays, owing to their thinness as compared to traditional cathode ray tube (CRT) display devices.

Flat panel display devices generally include a plurality of layers that are sequentially stacked. In order to fix the plurality of layers together, an adhesive layer may be disposed between two adjacent layers.

One example of a suitable adhesive layer is a photo-curable adhesive layer. Photo-curable adhesive layers may have a stable adhesive force after being cured by a light source. Such a photo-curable adhesive layer, however, has weak adhesive force when it is not sufficiently cured, and may experience degradation of adhesiveness over time.

SUMMARY

A display device includes a display panel having a display area and a non-display area. A window is disposed on the display panel. A bezel portion is disposed on the window. The bezel portion at least partially overlaps the non-display area. An adhesive layer is disposed between the display panel and the window. An interlayer is disposed between the bezel portion and the adhesive layer. The interlayer has at least one ultrasound transmitting area overlapping the bezel portion.

A display device includes a display panel having a display area and a non-display area. A window is disposed on the display panel. A bezel portion is disposed on the window. The bezel portion at least partially overlaps the non-display area. An adhesive layer is disposed between the display panel and the window. An interlayer is disposed between the bezel portion and the adhesive layer. The interlayer has a concave portion and the concave portion at least partially overlaps the bezel portion.

A display device includes a display panel having a display area and a non-display area. A window is disposed on the display panel. A bezel portion is disposed on the window. The bezel portion at least partially overlaps the non-display area. An adhesive layer is disposed between the display panel and the window. The display panel includes a first substrate and a wiring unit. The wiring unit includes a plurality of wirings disposed on the first substrate. The wiring unit has a wide gap portion defined by two neighboring wirings. A size of a gap between the two wirings in the wide gap portion is greater than a size of a gap between the two wirings in an area adjacent to the wide gap portion. The wide gap portion at least partially overlaps the bezel portion.

A display device includes a display panel configured to display an image. A touch panel is configured to detect a touch event. The touch panel is disposed on the display panel. An adhesive layer is disposed on the touch panel. A covering layer is disposed on the adhesive layer. The covering layer includes a window and a bezel area at least partially surrounding the window. An interlayer is disposed between the covering layer and the adhesive layer. The interlayer includes a base portion overlapped by the bezel area of the covering layer. The base portion of the interlayer includes one or more ultrasound transmitting areas configured to transmit ultrasonic waves to a greater extent than the base portion.

BRIEF DESCRIPTION OF THE DRAWINGS

A more complete appreciation of the present invention and many of the attendant aspects thereof will be readily obtained as the same becomes better understood by reference to the following detailed description when considered in connection with the accompanying drawings, wherein.

DETAILED DESCRIPTION

Figure 1:
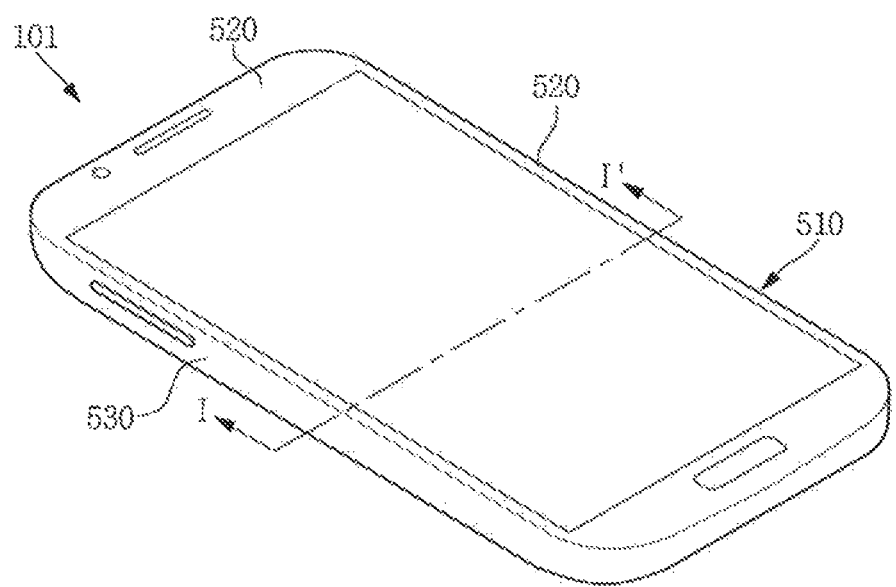
FIG. 1 is a perspective view illustrating a display device according to an exemplary embodiment of the present invention.

In describing exemplary embodiments of the present invention illustrated in the drawings, specific terminology is employed for sake of clarity. However, the present invention is not intended to be limited to the illustrations or any specific terminology, and it is to be understood that each element includes all equivalents.

In the drawings, the size of layers and areas may be exaggerated for clarity and ease of description thereof. When an element such as a layer, area, plate, etc. is referred to as being "on" another element, it may be directly on the other element, or intervening elements may be present therebetween.

The spatially relative terms "below", "beneath", "less", "above", "upper", and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in the other direction, and thus the spatially relative terms may be interpreted differently dePE$_n$ding on the orientations.

Throughout the specification, when an element is referred to as being "connected" to another element, the element may be "directly connected" to the other element, and/or "electrically connected" to the other element with one or more intervening elements interposed therebetween. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

Terms such as "about" or "approximately," as used herein, may be inclusive of the stated value and may additionally include a range of deviation for the particular value, as determined by one of ordinary skill in the art, considering the measurement in question and the error associated with measurement of the particular quantity (e.g., the limitations of the measurement system). For example, "about" may mean within one or more standard deviations, or within ±30%, 20%, 10%, 5% of the stated value.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Some of the parts which are not associated with the description may not be provided in order to specifically describe embodiments of the present invention. It is to be understood that with respect to some figures, some elements might not be described and that in these cases, it is to be assumed that the elements not described are similar to or identical to corresponding elements that have already been described. Moreover, like reference numerals may refer to like elements throughout the specification.

Hereinafter, an exemplary embodiment of the present invention will be described with reference to FIGS. 1, 2, 3, 4 and 5.

Figure 2:
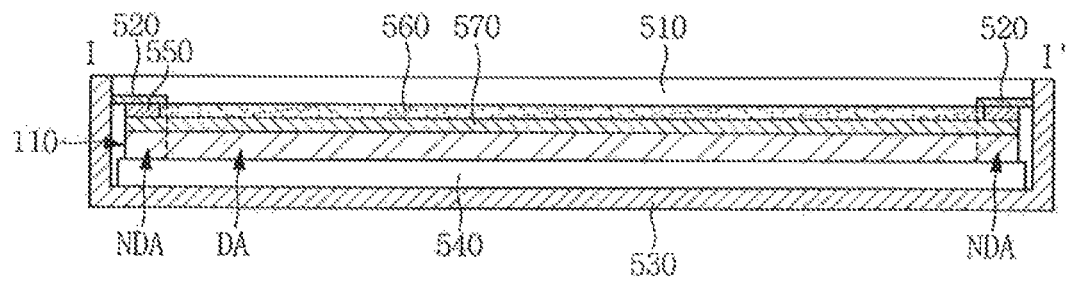
FIG. 2 is a cross-sectional view taken along line I-I' of FIG. 1.

FIG. 1 is a perspective view illustrating a display device 101 according to an exemplary embodiment of the present invention, and FIG. 2 is a cross-sectional view taken along line I-I' of FIG. 1.

The display device 101 illustrated in FIGS. 1 and 2 includes a window 510, a case 530 coupled to the window 510 to provide an accommodating space, and a display panel 110 disposed in the space defined by the window 510 and the case 530.

The display panel 110 is mounted within the case 530, along with a support portion 540. The support portion 540 may be, for example, a cushion member, but exemplary embodiments of the present invention are not limited thereto. Elements, such as a battery for driving the display panel 110 may be disposed at the support portion 540.

The display panel 110 has a display area DA and a non-display area NDA. The display area DA is an area in which an image is displayed. The non-display area NDA may surround the display area DA, for example. Examples of the display panel 110 may include a liquid crystal display ("LCD") panel, an organic light emitting diode ("OLED") display panel, or the like. The detailed structure of the display panel 110 will be described below.

The window 510 on the display panel 110 may include a light transmitting member such as glass, plastic, or the like.

A bezel portion 520 is disposed on the window 510 and overlaps the non-display area NDA of the display panel 110. The bezel portion 520 may surround the window 510 and the bezel portion 520 may be disposed above, below, and to the left and right sides of the window 510. Referring to FIGS. 1 and 2, the bezel portion 520 is disposed at an edge portion of the window 510. For example, the bezel portion 520 may be provided by forming an opaque coating layer at the edge portion of the window 510. The bezel portion 520 may protrude from a surface of the window 510.

According to an exemplary embodiment of the present invention, the bezel portion 520 may be provided by defining a groove at the edge portion of the window 510 and then filling the groove with an opaque coating layer. In such an exemplary embodiment of the present invention, the bezel portion 520 might not protrude from the surface of the window 510.

An adhesive layer 570 is disposed between the display panel 110 and the window 510. In addition, an interlayer 550 is disposed between the bezel portion 520 and the adhesive layer 570. Referring to FIG. 2, a touch panel 560 is disposed between the window 510 and the adhesive layer 570. The touch panel 560 is attached to the display panel 110 by the adhesive layer 570.

The touch panel 560 is a device configured to recognize a touch. The touch panel 560 may include a plurality of sensor electrodes configured for recognizing a touch. The touch panel 560 may be a capacitive-type touch panel, a resistive-type touch panel, or any other type of touch panel that may be used in the described manner.

The touch panel 560 may be connected to the interlayer 550. According to an exemplary embodiment of the present invention, the interlayer 550 may be electrically conductive. The conductive interlayer 550 may serve as the ground, for example. The interlayer 550 may suppress or otherwise prevent generation of static electricity in the touch panel 560. In addition, the interlayer 550 may serve as a wiring for connecting the touch panel 560 to another terminal or another device. Exemplary embodiments of the present invention are not limited thereto, the interlayer 550 may be light shielding pattern and include light shielding material.

The roles of the interlayer 550 may vary depending on, for example, the material and the design of the interlayer 550.

The interlayer 550 may include a metal. The interlayer 550 may or might not further include an element other than metal. For example, the interlayer 550 may include copper (Cu), silver (Ag), gold (Au), aluminum (Al), and/or titanium (Ti).

The interlayer 550 may have a monolayer structure or a multilayer structure in which a plurality of layers are stacked. The interlayer 550 may include a metal layer such as copper (Cu), silver (Ag), gold (Au), aluminum (Al), and/or titanium (Ti). In addition, the interlayer 550 may include a transparent conductive oxide (TCO) such as ITO, IZO, AZO, IGZO, or the like. For example, the interlayer 550 may include at least one of a metal layer and a TCO layer.

Figure 3:
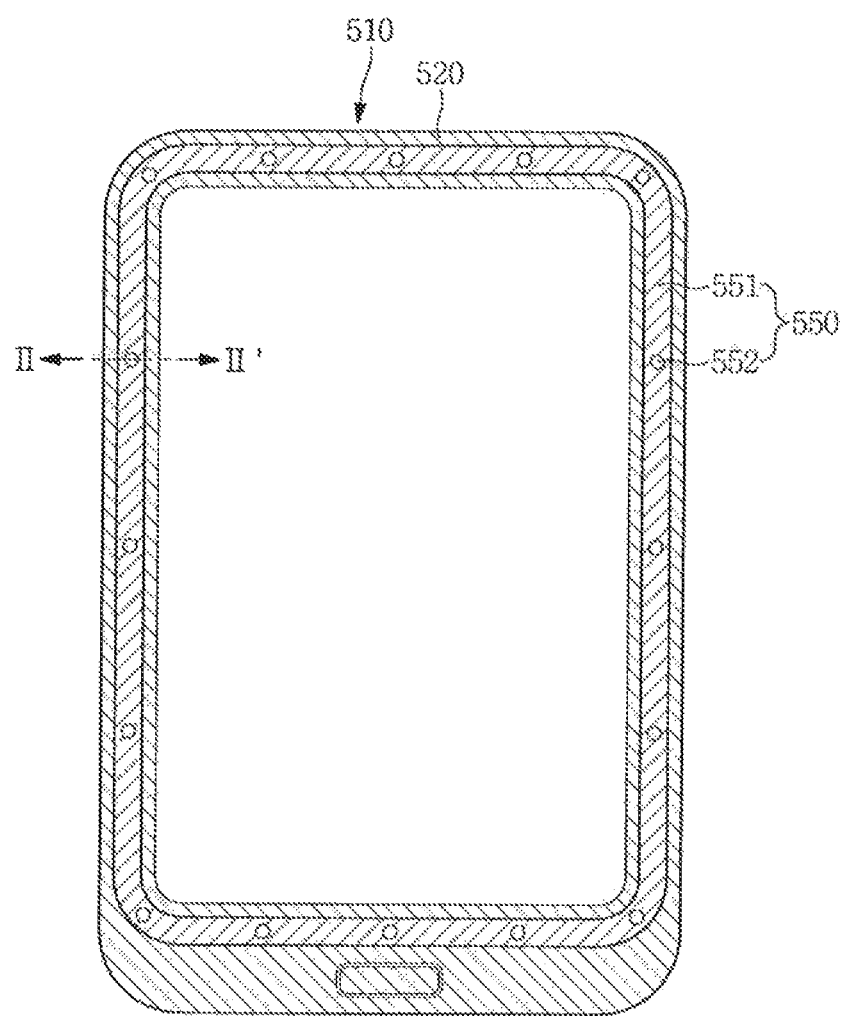
FIG. 3 is a plan view illustrating disposition of a window and an interlayer.
Figure 4:
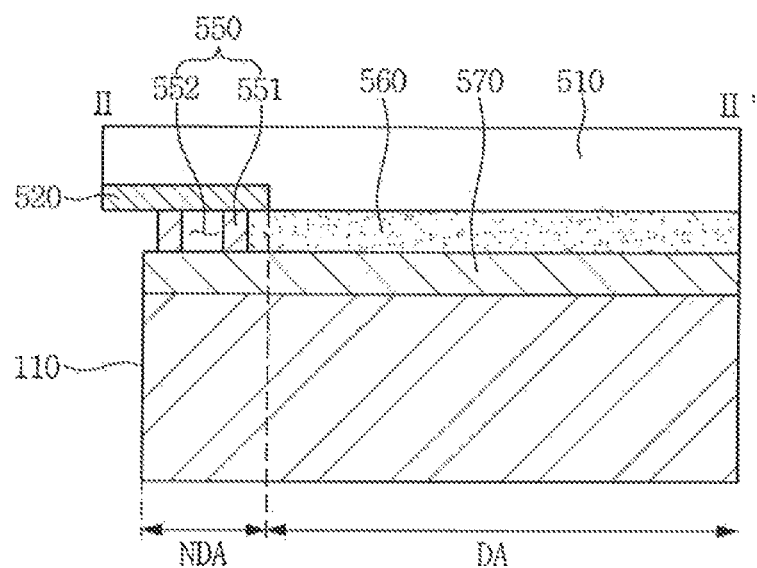
FIG. 4 is a cross-sectional view taken along line II-II' of FIG. 3.

FIG. 3 is a plan view illustrating disposition of the window 510 and the interlayer 550, and FIG. 4 is a cross-sectional view taken along line II-II' of FIG. 3.

Referring to FIGS. 3 and 4, the interlayer 550 is disposed on the bezel portion 520. The interlayer 550 does not overlap the display area DA of the display panel 110. The interlayer 550 forms a closed loop along the edge of the window 510.

In addition, the interlayer 550 may have at least one through hole 552 overlapping the bezel portion 520. For example, the interlayer 550 may include a base portion 551 and the through hole 552. The through hole 552 may be defined by removing a portion of the base portion 551. In such an exemplary embodiment of the present invention, the base portion 551 may include, for example, a conductive material.

The through hole 552 allows ultrasonic waves to pass therethrough. In an ultrasound inspection process for confirming whether or not the adhesive layer 570 is properly cured, using ultrasonic waves, the through hole 552 becomes an ultrasound inspection area. In one exemplary embodiment of the present invention, the ultrasound inspection area refers to an area through which ultrasonic waves are passed through to carry out the ultrasound inspection. Accordingly, the ultrasound inspection area may be referred to as an ultrasonic wave transmission area.

As such, in the case where the ultrasound inspection area defined by the through hole 552 is secured, an ultrasound inspection may be smoothly carried out. Accordingly, the ultrasound inspection may determine whether or not the adhesive layer 570 is properly cured or whether or not there non-curing defects are present.

The through hole 552 may be of a size suitable to allow ultrasonic waves to be passed therethrough. When the size of the through hole 552 is too small, the ultrasonic wave might not readily pass through the through hole 552. When the size of the through hole 552 is too large, the through hole 552 occupies an excessive amount of space, which may lead to an increase in the size of the bezel portion 520. The size of the through hole 552 may be represented by a diameter of the through hole 552.

In consideration of the size of an ultrasonic wave generator or the size of a probe for ultrasound inspection, the through hole 552 may have a diameter in a range of about 100 μm to about 300 μm, for example.

The shape of the through hole 552 is not particularly limited. The through hole 552 may have a circular, oval, semicircular, or polygonal planar shape. For example, the through hole 552 may have a quadrangular or pentagonal planar shape.

When ultrasonic waves propagate through an interface between layers respectively including different materials, propagation speed of the ultrasonic wave may change and the ultrasonic wave may be reflected from the interface. For example, in the case where the interlayer 550 is disposed in the ultrasonic wave transmission area, a propagation speed of ultrasonic waves may change at an interface between the interlayer 550 and another layer, and the ultrasonic waves may be reflected from the interface. Accordingly, when there are a plurality of interlayer interfaces in the ultrasonic wave transmission area, the speed and accuracy of the ultrasound inspection may be degraded.

In particular, in the case where a conductor such as a metal is present in the ultrasonic wave transmission area, ultrasound inspection might not be performed accurately. When a conductor such as a metal is present in the ultrasonic wave transmission area, the propagation speed or the reflection characteristics of the ultrasonic waves may be changed, thereby causing signal disturbance in the ultrasound inspection process.

According to an exemplary embodiment of the present invention, the through hole 552 does not overlap a conductor in a space between the window 510 and the adhesive layer 570. For example, no conductor is disposed in the area of the through hole 552 between the window 510 and the adhesive layer 570. Accordingly, more accurate ultrasound inspection is possible.

Figure 5:
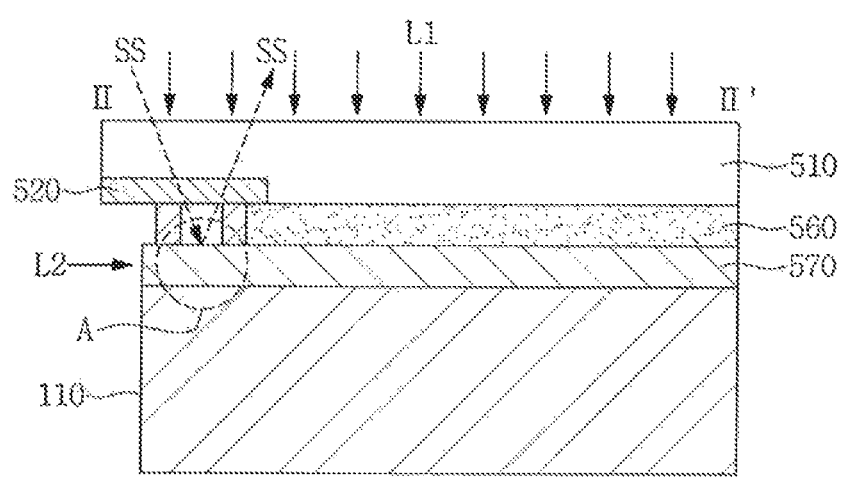
FIG. 5 is a cross-sectional view illustrating light irradiation and ultrasonic wave irradiation.

FIG. 5 is a cross-sectional view illustrating light irradiation and ultrasonic wave irradiation.

The adhesive layer 570 is used to attach the display panel 110 and the touch panel 560. The adhesive layer 570 is formed by disposing an adhesive composition between the display panel 110 and the touch panel 560 and then the adhesive layer 570 is cured by irradiating the adhesive layer 570 with light, such that the adhesive layer 570 may have stable adhesive force. As such, the adhesive layer 570 having a stable adhesive force resulting from photo-curing is also referred to as a photo-curable adhesive layer.

Referring to FIG. 5, the adhesive layer 570 may be cured by being irradiated by light L1 through the window 510. In such an exemplary embodiment of the present invention, an ultraviolet light (UV) may be the light L1.

However, the light L1 is blocked at a portion below the bezel portion 520, and thus a portion of the adhesive layer 570 below the bezel portion 520 might not be sufficiently cured. In order to substantially prevent non-curing below the bezel portion 520, a light L2, e.g., a UV light, may irradiate a side surface of the adhesive layer 570. Because there is a limit in a transmittance of the light L2 radiated to the side surface, a portion of the adhesive layer 570 below the bezel portion 520, e.g., in area "A" in FIG. 5, might not be sufficiently cured. In the case where the adhesive layer 570 is not sufficiently cured, the adhesive layer 570 might not achieve a strong adhesive force, and the adhesive force of the adhesive layer 570 may be degraded over time.

Accordingly, in order to identify whether or not the adhesive layer 570 below the bezel portion 520 is sufficiently cured, the ultrasound inspection may be carried out. An ultrasonic wave SS is radiated to a portion below the bezel portion 520 for the ultrasound inspection. The adhesive layer 570 is irradiated by the ultrasonic wave SS through the through holes 552. In the case where the interlayer 550, e.g., a conductor such as a metal in particular, is absent in the through hole 552 between the window 510 and the adhesive layer 570, the ultrasound inspection may be stably carried out. To this end, the through hole 552 might not overlap the interlayer 550 or a conductor in the space between the window 510 and the adhesive layer 570.

The size and gap of the through holes 552 may vary depending on the size of the display device 101. In addition, a distance from one end of the interlayer 550 to the through hole 552 may vary depending on a width of the interlayer 550. For example, the distance from one end of the interlayer 550 to the center of the through hole 552 may be in a range of about 150 μm to about 300 μm.

Figure 6:
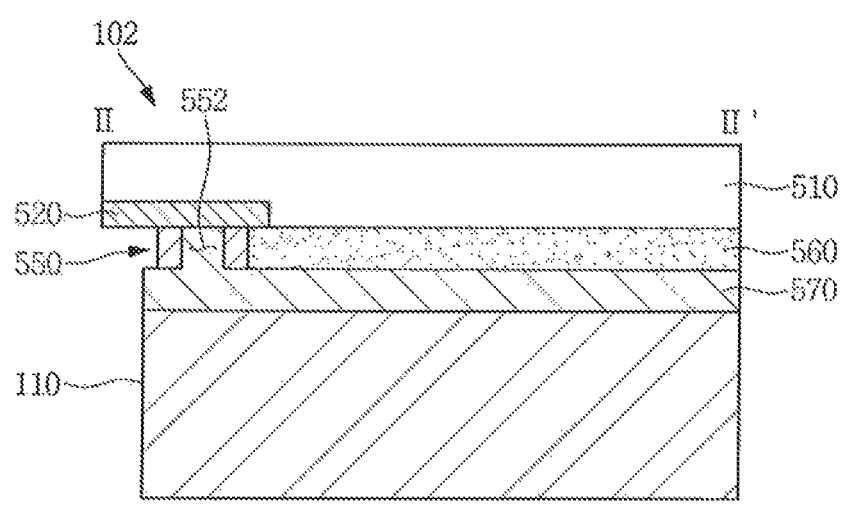
FIG. 6 is a partial cross-sectional view illustrating a display device according to an exemplary embodiment of the present invention.

FIG. 6 is a partial cross-sectional view illustrating a display device 102 according to an exemplary embodiment of the present invention. Referring to FIG. 6, at least a portion of the adhesive layer 570 may be disposed in a space defined by the through hole 552. For example, curing may be performed after an adhesive composition forming the adhesive layer 570 is filled in the through holes 552, such that at least a portion of the adhesive layer 570 may fill the through hole 552.

Further, referring to FIG. 6, the adhesive layer 570 may contact the bezel portion 520 through the through hole 552.

Figure 7:
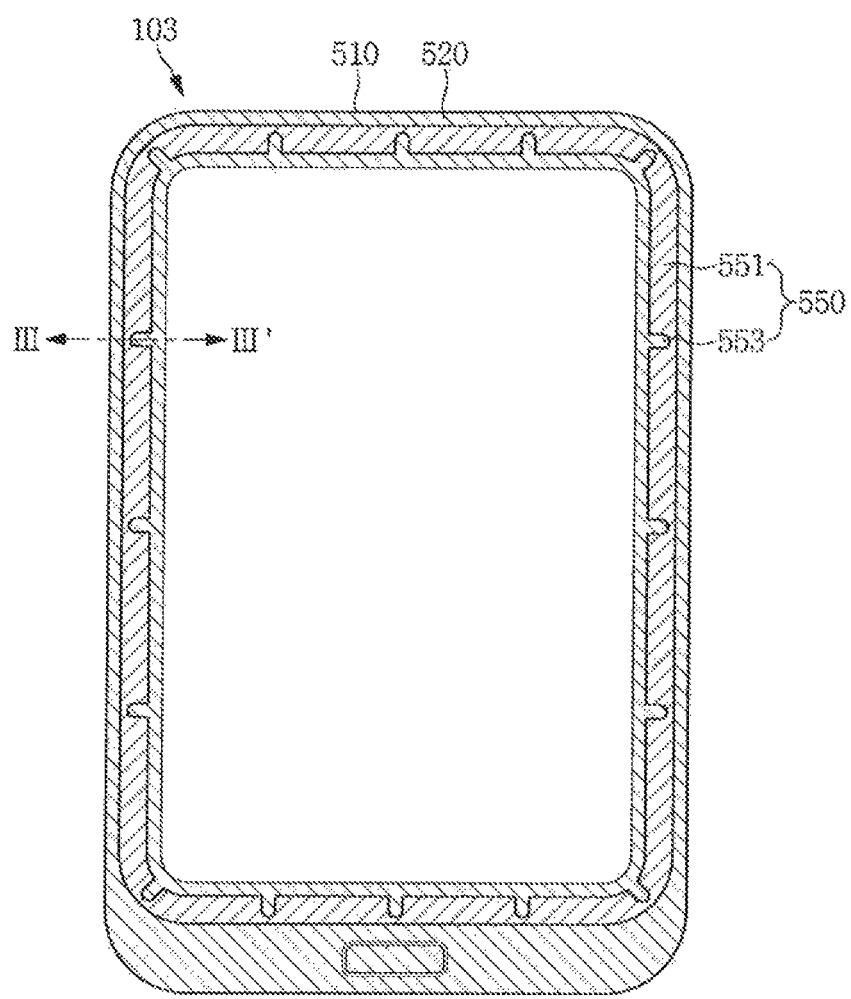
FIG. 7 is a plan view illustrating disposition of a window and an interlayer according to an exemplary embodiment of the present invention.
Figure 8:
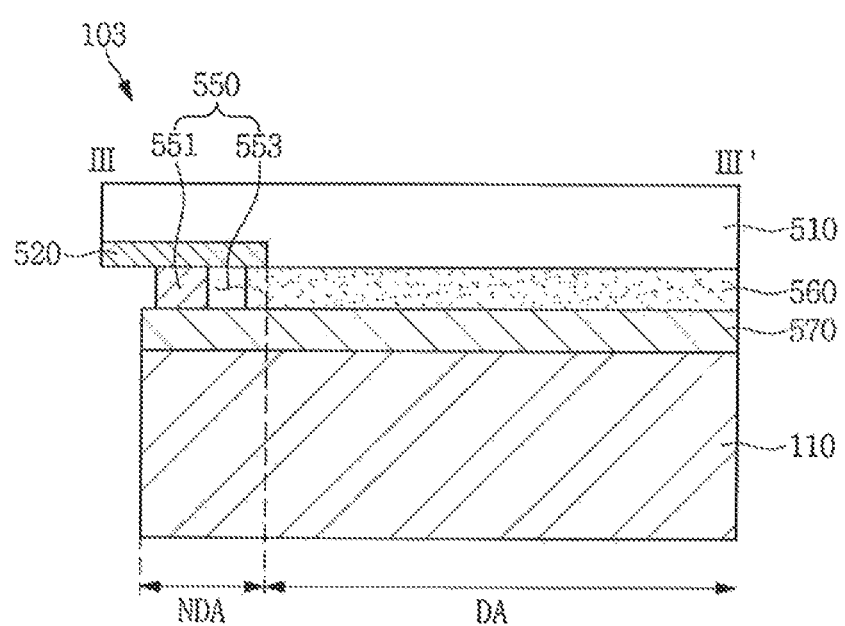
FIG. 8 is a cross-sectional view taken along line III-III' of FIG. 7.

FIG. 7 is a plan view illustrating disposition of a window 510 and an interlayer 550 according to an exemplary embodiment of the present invention, and FIG. 8 is a cross-sectional view taken along line III-III' of FIG. 7.

Referring to FIG. 7, the interlayer 550 has a concave portion 553, and the concave portion 553 overlaps the bezel portion 520. When viewed on a plane, the concave portion 553 may have a concave bay shape. For example, the concave portion 553 may be defined by removing a portion of a base portion 551 constituting the interlayer 550. For example, the concave portion 553 may be defined by a curved boundary of the base portion 551.

Referring to FIGS. 7 and 8, the interlayer 550 surrounds a display area DA. The interlayer 550 forms a closed loop along an edge of the window 510. Referring to FIG. 7, the concave portion 553 is open toward the display area DA.

The concave portion 553 does not overlap a conductor such as a metal in a space between the window 510 and the adhesive layer 570.

Referring to FIG. 8, a touch panel 560 is disposed between the window 510 and an adhesive layer 570. In such an exemplary embodiment of the present invention, the concave portion 553 may be adjacent to the touch panel 560.

However, exemplary embodiments of the present invention are not limited thereto. The concave portion 553 may be open toward a direction opposite to the display area DA.

A size of the concave portion 553 may be defined by a diameter. The concave portion 553 may have a diameter in a range of about 100 μm to about 300 μm. The concave portion 553 may allow ultrasonic waves to pass therethrough to carry out an ultrasound inspection operation.

In FIG. 8, a space defined by the concave portion 533 is depicted as not filled with the adhesive layer 570. However, exemplary embodiments of the present invention are not limited thereto, and the space defined by the concave portion 533 may be filled with the adhesive layer 570.

For example, at least a portion of the adhesive layer 570 may be disposed in a space defined by the concave portion 533. For example, curing may be performed after an adhesive composition forming the adhesive layer 570 is filled in the concave portion 533, such that at least a portion of the adhesive layer 570 fills the concave portion 533.

Figure 9:
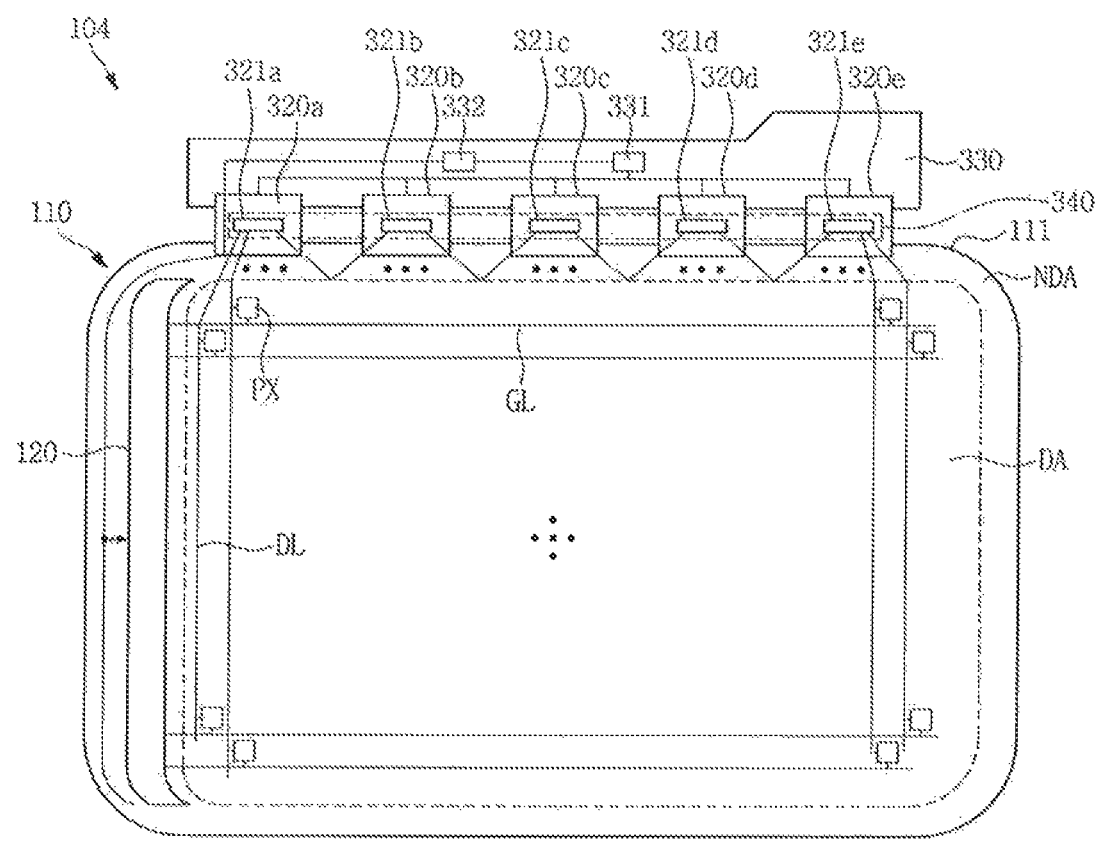
FIG. 9 is a plan view illustrating a display device according to an exemplary embodiment of the present invention.
Figure 10:
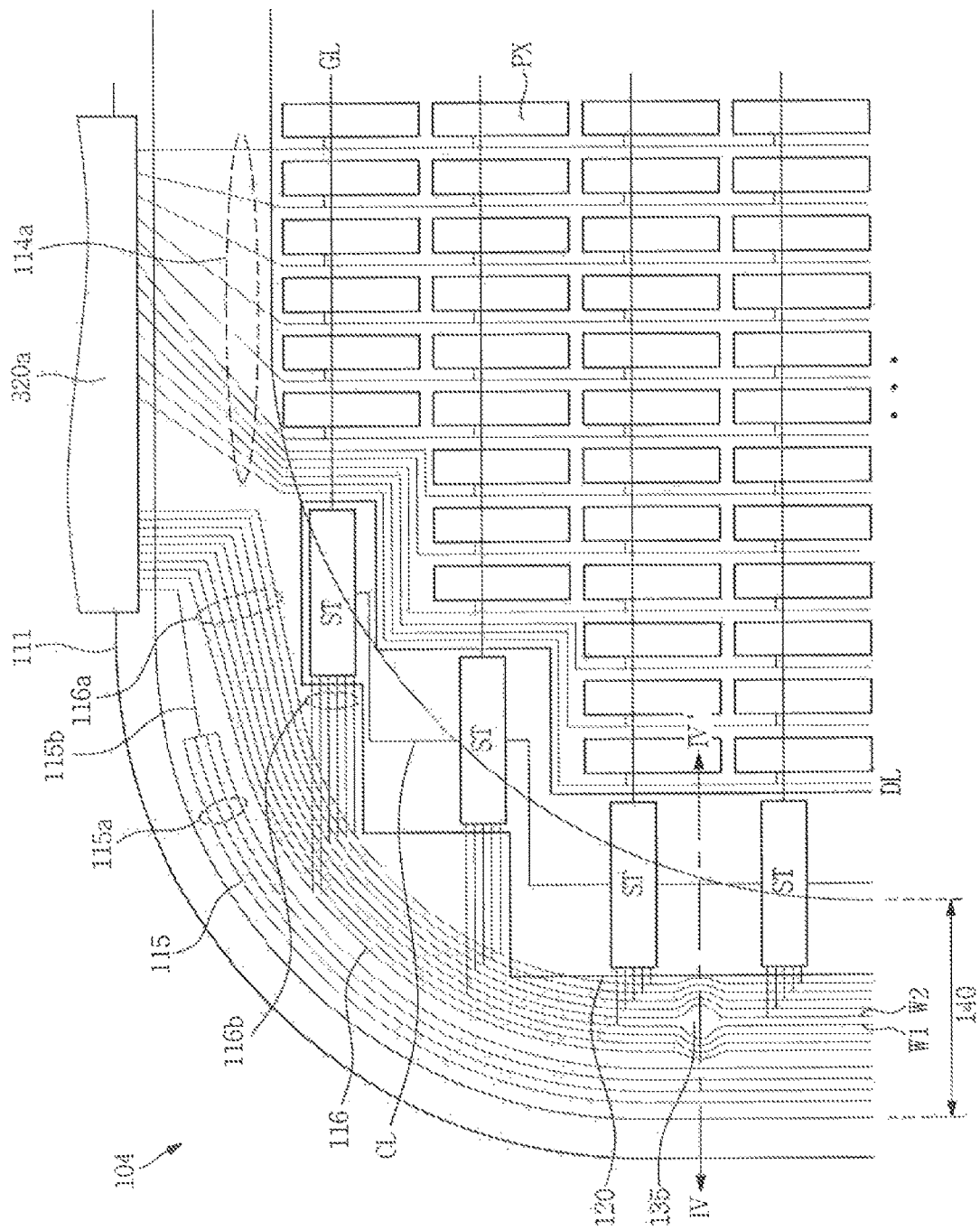
FIG. 10 is a detailed plan view illustrating a portion of FIG. 9.
Figure 11:
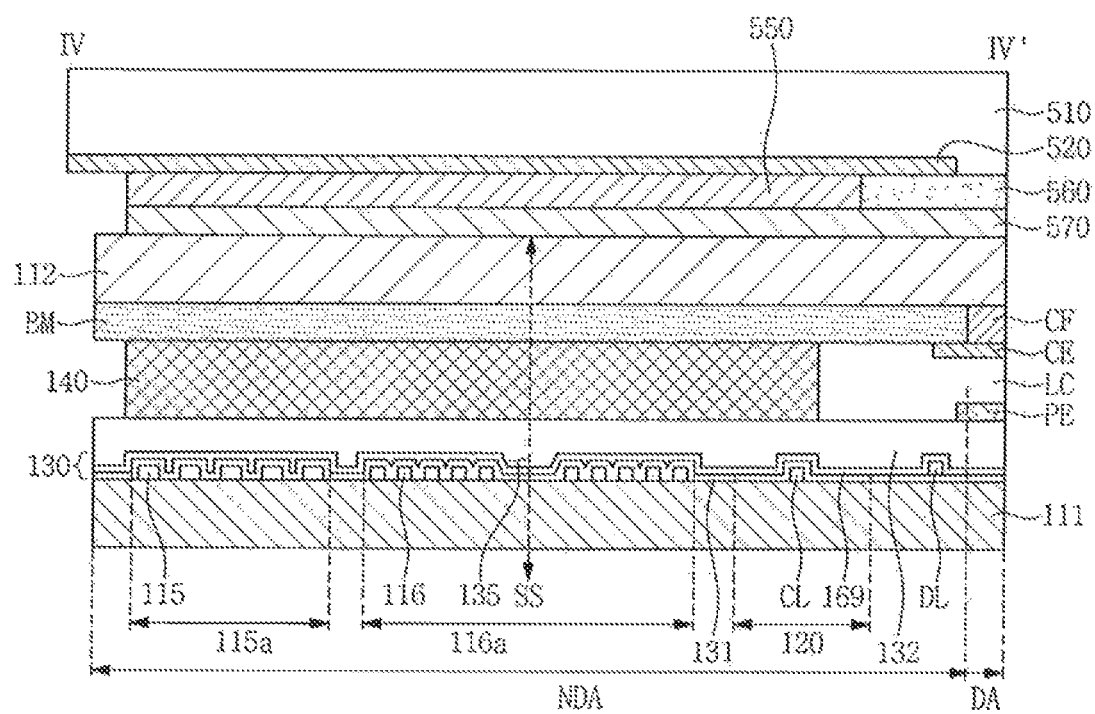
FIG. 11 is a cross-sectional view taken along line IV-IV' of FIG. 10.

FIG. 9 is a plan view illustrating a display device 104 according to an exemplary embodiment of the present invention, FIG. 10 is a detailed plan view illustrating a portion of FIG. 9, and FIG. 11 is a cross-sectional view taken along line IV-IV' of FIG. 10.

Referring to FIGS. 9, 10 and 11, a display device 104 according to an exemplary embodiment of the present invention includes a display panel 110 having a display area DA and a non-display area NDA, a window 510 on the display panel 110, a bezel portion 520 disposed on the window 510 and overlapping the non-display area NDA, and an adhesive layer 570 disposed between the display panel 110 and the window 510. The display device 104 may further include an interlayer 550 disposed between the bezel portion 520 and the adhesive layer 570. The interlayer 550 may be electrically conductive. The interlayer 550 includes, for example, a metal.

The display panel 110 includes a first substrate 111 and a wiring unit 130. The wiring unit 130 includes a plurality of wirings on the first substrate 111. In addition, the wiring unit 130 includes a wide gap portion 135 defined by two neighboring wirings w1 and w2. A gap between the two wirings w1 and w2 in the wide gap portion 135 is larger than a gap between the two wirings w1 and w2 in an area adjacent to the wide gap portion 135. The wide gap portion 135 overlaps the bezel portion 520.

The display device 104 illustrated in FIG. 9 may be an LCD device. However, exemplary embodiments of the present invention are not limited thereto, and the structure illustrated in FIG. 9 may be applied to an OLED display device or another form of display device.

The display device 104 illustrated in FIG. 9 includes the display panel 110 for displaying an image and a data driver 340 applying a data voltage to the display panel 110. In such an exemplary embodiment of the present invention, the display panel 110 may be an LCD panel.

The display panel 110 includes a first substrate 111, a second substrate 112 facing the first substrate 111, and a liquid crystal layer LC between the first substrate 111 and the second substrate 112. In addition, the display panel 110 includes a display area DA for displaying an image and a non-display unit NDA within which no image is displayed.

The wiring unit 130 is disposed on the first substrate 111. The wiring unit 130 includes a plurality of gate lines GL, a plurality of data lines DL, and other signal lines, and further includes a plurality of thin film transistors ("TFT"). A conductive line, as used herein, may describe the gate line GL, the data line DL, other signal lines, a power line, or the like.

For example, the plurality of gate lines GL and the plurality of data lines DL insulated from and intersecting the plurality of gate lines GL are disposed at the display area DA. In addition, a pixel PX connected to the gate line GL and the data line DL to display an image is disposed at the display area DA.

The gate driver 120 is connected to the plurality of gate lines GL and is disposed at the non-display area NDA. The gate driver 120 is electrically connected to the plurality of gate lines GL to sequentially apply a gate voltage to the plurality of gate lines GL.

The data driver 340 is connected to the plurality of data lines DL and is disposed at the non-display area NDA. The data driver 340 includes a plurality of driving circuit boards 320a, 320b, 320c, 320d and 320e. For example, the plurality of driving circuit boards 320a, 320b, 320c, 320d and 320e may be a tape carrier package (TCP) or a chip on film (COF). A plurality of data driving integrated circuits ("ICs") 321a, 321b, 321c, 321d and 321e are mounted on the plurality of driving circuit boards 320a, 320b, 320c, 320d and 320e. The plurality of data driving ICs 321a, 321b, 321c, 321d and 321e are electrically connected to the plurality of data lines DL to apply a data voltage to the plurality of data lines DL.

The display device 104 may further include a control printed circuit board ("PCB") 330 configured to control driving of the gate driver 120 and the plurality of data driving ICs 321a, 321b, 321c, 321d and 321e. The control PCB 330 outputs image data and a data control signal for controlling the driving of the plurality of data driving ICs 321a, 321b, 321c, 321d and 321e, and outputs a gate control signal for controlling the driving of the gate driver 120.

The control PCB 330 may include a timing controller 331 that receives image data from an external source and generates the data control signal and the gate control signal, and a gate control circuit 332 that generates the gate control signal. However, exemplary embodiments of the present invention are not limited to such structure.

The timing controller 331 controls the driving of the plurality of data driving ICs 321a, 321b, 321c, 321d and 321e and the gate driver 120. The gate control circuit 332 generates a clock signal for driving the gate driver 120, a start signal for notifying the start of the gate signal, and the like.

The control PCB 330 applies the data control signal and the image data to the plurality of data driving ICs 321a, 321b, 321c, 321d and 321e through the plurality of driving circuit boards 320a, 320b, 320c, 320d and 320e. In addition, the control PCB 330 applies the gate control signal to the gate driver 120 through a driving circuit board 320a that is adjacent to the gate driver 120.

However, exemplary embodiments of the present invention are not limited thereto, and the plurality of data driving ICs 321a, 321b, 321c, 321d and 321e may be directly mounted in the display panel 110, mounted on a flexible printed circuit film to be attached to the display panel 110, or may be mounted on a separate PCB. In an exemplary embodiment of the present invention, the plurality of data driving ICs 321a, 321b, 321c, 321d and 321e may be integrated with the display panel 110, along with the gate line GL and the TFT. According to an exemplary embodiment of the present invention, the plurality of data driving ICs 321a, 321b, 321c, 321d and 321e, the timing controller 331, and the gate control circuit 332 may be integrated into a single chip.

Referring to FIGS. 10 and 11, the plurality of gate lines GL, the plurality of data lines DL, and the plurality of pixels PX are disposed on the first substrate 111.

In addition, a data link wiring 114a, a common voltage wiring unit 115a, a gate link portion 116a, and the gate driver 120 are disposed at the non-display area NDA on the first substrate 111. The gate driver 120 includes a plurality of stages ST. A pixel electrode PE is disposed at the display area DA on the first substrate 111. A light blocking portion BM, a color filter CF, a common electrode CE, and the like are disposed on the second substrate 121.

The data link wiring 114a extends from the data line DL and electrically connects the data driver 340 and the data line DL.

The common voltage wiring unit 115a includes a plurality of common voltage wirings 115 arranged to have a uniform gap. One end of the plurality of common voltage wirings 115 is connected to a common voltage generator through one common voltage extension wiring 115b.

The plurality of common voltage wirings 115 are electrically connected to the common electrode CE.

The gate link portion 116a includes a plurality of signal lines 116 between the common voltage wiring unit 115a and the gate driver 120. The gate link portion 116a includes various wirings, for example, a gate start signal line, a plurality of clock signal lines, a forward signal line, a reverse signal line, a reset signal line, a base voltage line and the like. One end of each signal line 116 of the gate link portion 116a is connected to the timing controller 331 or the gate control circuit 332. Further, another end of each signal line 116 of the gate link portion 116a is selectively connected to the gate driver 120 through a signal connection wiring 116b.

The gate driver 120 is formed together with the TFT of the pixel PX. Such a structure in which the gate driver 120 is formed on a substantially same substrate as a substrate on which the TFT of the pixel PX is disposed is also referred to as an amorphous silicon gate (ASG) structure.

The gate driver 120 generates a gate signal according to a gate start signal, a plurality of clock signals, a forward signal, a reverse signal, a reset signal, and a base voltage applied from the gate link portion 116a, and applies the gate signal to the gate line GL. The gate driver 120 includes a plurality of stages ST connected to the gate lines GL, respectively. The plurality of stages ST apply gate signals to the gate lines GL, respectively. Further, adjacent stages ST are connected to each other by a carry line CL for transmitting a carry signal.

For example, in response to the gate start signal applied from the gate start signal line or a previous stage, each of the plurality of stages ST applies, to the gate line GL, a gate signal which is a clock signal applied from one of the plurality of clock signal lines. The gate line GL is connected to the gate driver 120 and applies the gate signal to the pixel PX.

The data lines DL are disposed between the stage ST and the pixels PX. Referring to FIG. 10, the data line DL extends in a step-like shape between the stage ST and the pixels PX. However, exemplary embodiments of the present invention are not limited thereto, and the data line DL may extend in a slant or curved shape between the stage ST and the pixels PX.

Referring to FIG. 11, the display device 104 includes a sealing portion 140 sealing the first substrate 1 and the second substrate 112. The sealing portion 140 is disposed to overlap the light blocking portion BM and to partially overlap the stage ST of the gate driver 120. The sealing portion 140 may be formed by a conventional method, using materials conventionally used in the art.

Referring to FIG. 11, the common voltage wiring unit 115a and the gate link portion 116a are disposed on the first substrate 111, and a gate insulating layer 131, an insulating interlayer 169, and a protective layer 132 are disposed thereon. In addition, the carry line CL connecting respective stages ST is also disposed on a substantially same layer as a layer on which the common voltage wiring unit 115a and the gate link portion 116a are disposed.

Referring to FIGS. 10 and 11, the wide gap portion 135 is defined among the signal lines 116 constituting the gate link portion 116a. As such, the wide gap portion 135 may be defined by the wirings.

For example, the wide gap portion 135 may be defined by two wirings W1 and W2 opposing each other with the wide gap portion 135 interposed therebetween. Referring to FIG. 10, the two wirings W1 and W2 defining the wide gap portion 135 are the signal lines 116 of the gate link portion 116a. In FIG. 10, at least two signal lines among the signal lines 116 of the gate link portion 116a define the wide gap portion 135.

A gap between two wirings W1 and W2 in the wide gap portion 135 is greater than a gap between the two wirings w1 and w2 in an area adjacent to the wide gap portion 135.

The wide gap portion 135 may also be formed in the data link wiring 114a and the common voltage wiring unit 115a.

The shape of the wide gap portion 135 is not limited to any particular arrangement. For example, the wide gap portion 135 may have a circular, oval, semicircular, or polygonal planar shape. For example, the wide gap portion 135 may have a quadrangular or pentagonal planar shape.

Ultrasonic waves may pass through the wide gap portion 135 such that the ultrasound inspection may be carried out. Accordingly, the wide gap portion 135 becomes an ultrasound inspection area. The ultrasound inspection may determine whether or not the adhesive layer 570 located above the wide gap portion 135 is properly cured and the ultrasound inspection may additionally determine a degree to which the adhesive layer 570 has been cured.

The interlayer 550 is disposed below the bezel portion 520. When ultrasonic waves are not smoothly radiated through the window 510, the ultrasonic waves may be radiated to a lower portion of the first substrate 111 for the ultrasound inspection. In such an exemplary embodiment of the present invention, the ultrasonic wave SS may be radiated through the wide gap portion 135 formed between the plurality of wirings on the first substrate 111.

A size of the wide gap portion 135 may be defined as a maximum gap between two wirings W1 and W2 that define the wide gap portion 135. The maximum gap between the two wirings W1 and W2 at the wide gap portion 135 may be within a range of about 100 μm to about 300 μm.

The wide gap portion 135 might not overlap a conductor in a space between the first substrate 111 and the adhesive layer 570. This arrangement may reduce or prevent the ultrasound signal from being disturbed by a conductor such as metal.

Referring to FIG. 11, the display device 104 includes a touch panel 560 disposed between the window 510 and the adhesive layer 570. The touch panel 560 may be connected to the interlayer 550.

Figure 12:
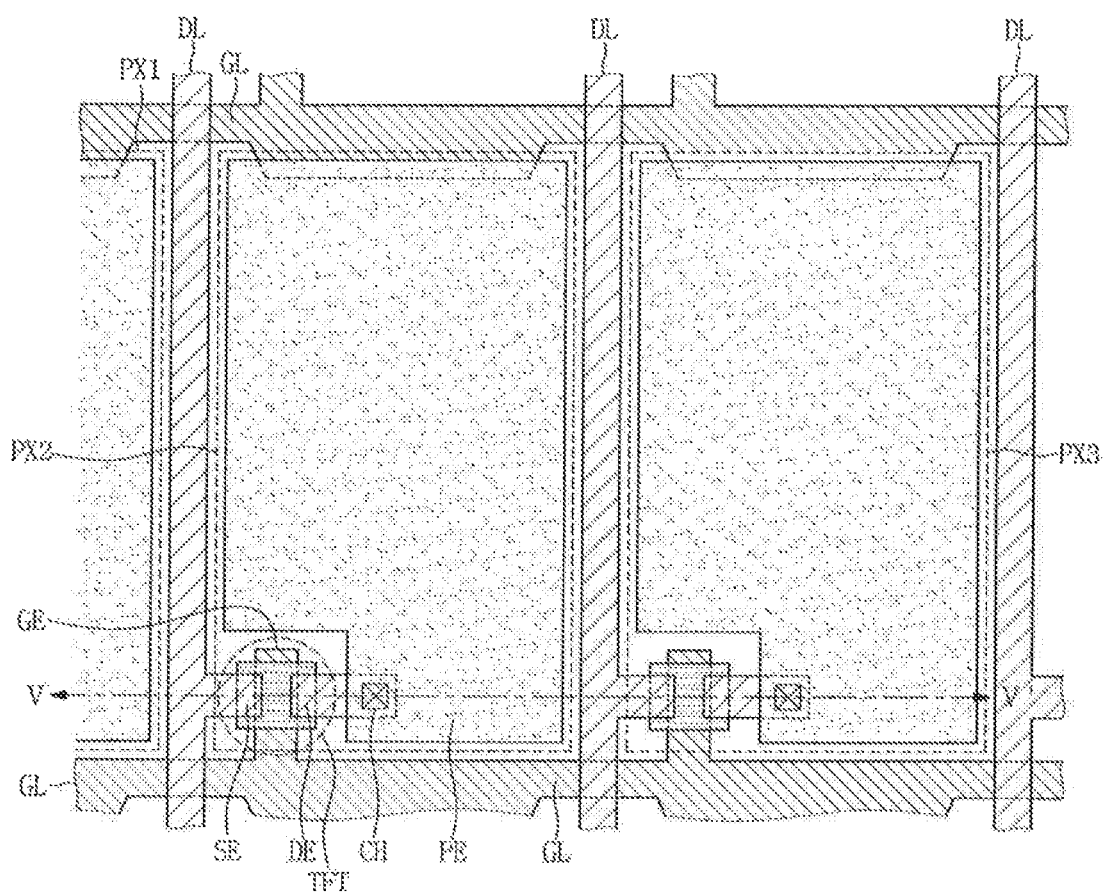
FIG. 12 is a plan view illustrating pixel arrangement of a display panel according to an exemplary embodiment of the present invention.
Figure 13:
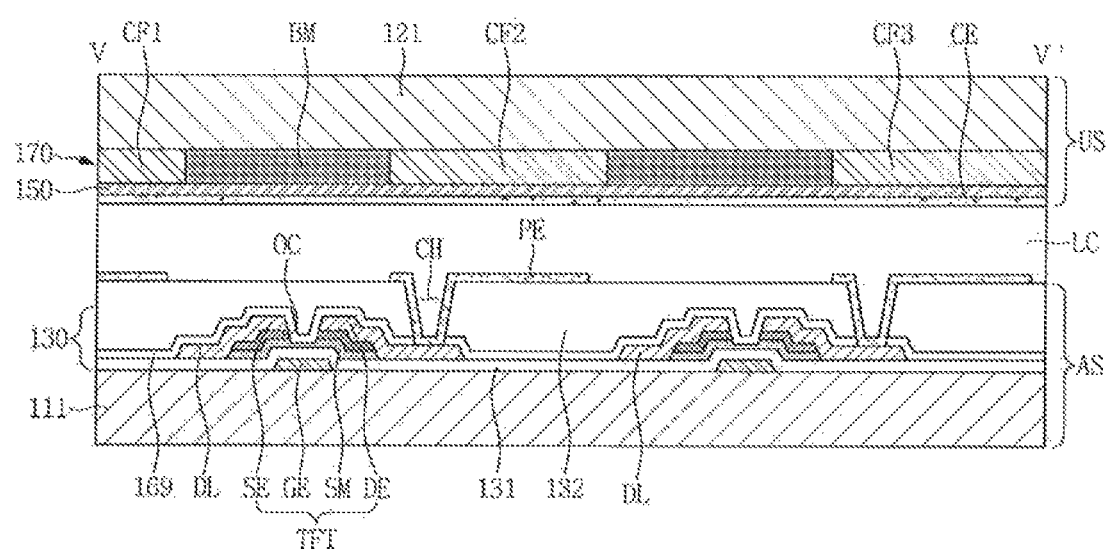
FIG. 13 is a cross-sectional view taken along line V-V' of FIG. 12.

FIG. 12 is a plan view illustrating pixel arrangement of a display panel according to an exemplary embodiment of the present invention, and FIG. 13 is a cross-sectional view taken along line V-V' of FIG. 12.

In detail, FIGS. 12 and 13 illustrate an LCD panel.

The LCD panel illustrated in FIGS. 12 and 13 includes a display substrate AS, an opposing substrate US, and a liquid crystal layer LC disposed between the display substrate AS and the opposing substrate US.

The display substrate AS includes a first substrate 111, a TFT, a pixel electrode PE, a gate insulating layer 131 and a protective layer 132. The TFT includes a semiconductor layer SM, an ohmic contact layer OC, a gate electrode GE, a source electrode SE and a drain electrode DE.

The first substrate 111 may include transparent materials such as glass or plastic.

A plurality of gate lines GL and the gate electrode GE are disposed on the first substrate 111. The gate line GL and the gate electrode GE are integrally formed. The gate line GL and the gate electrode GE may include or be formed of aluminum (Al) or alloys thereof, silver (Ag) or alloys thereof, copper (Cu) or alloys thereof, molybdenum (Mo) or alloys thereof, chromium (Cr), tantalum (Ta), and/or titanium (Ti). At least one of the gate line GL and the gate electrode GE may have a multilayer structure including at least two conductive layers that have different physical properties.

The gate insulating layer 131 is disposed over an entire surface of the first substrate 111 including the gate line GL and the gate electrode GE. The gate insulating layer 131 may include silicon nitride ($SiN_x$) or silicon oxide ($SiO_x$). In addition, the gate insulating layer 131 may have a multilayer structure including at least two insulating layers having different physical properties.

The semiconductor layer SM is disposed on the gate insulating layer 131. In such an exemplary embodiment of the present invention, the semiconductor layer SM overlaps the gate electrode GE below the gate insulating layer 131. The semiconductor layer SM may include amorphous silicon, polycrystalline silicon, or the like. The semiconductor layer SM may include an oxide semiconductor.

The ohmic contact layer OC is disposed on the semiconductor layer SM. For example, the ohmic contact layer OC is disposed on the semiconductor layer SM in an area other than a channel area.

Further, a plurality of data lines DL are disposed on the gate insulating layer 131. The data line DL intersects the gate line GL. The source electrode SE and the data line DL are integrally formed. The source electrode SE is disposed on the ohmic contact layer OC. The drain electrode DE is disposed on the ohmic contact layer OC and connected to the pixel electrode PE.

At least one of the data line DL, the source electrode SE and the drain electrode DE may include or be formed of a refractory metal, such as molybdenum, chromium, tantalum, and titanium, or an alloy thereof. Further, at least one of the data line DL, the source electrode SE and the drain electrode DE may have a multilayer structure including a refractory metal layer and a low-resistance conductive layer.

An insulating interlayer 169 is disposed over the entire surface of the first substrate 111 including the gate insulating layer 131, the semiconductor layer SM, the data line DL, the source electrode SE and the drain electrode DE. The insulating interlayer 169 may include an insulating material. The insulating layer 169 may protect the channel area and other exposed portions of the semiconductor layer SM.

In one exemplary embodiment of the present invention, a portion from a surface of the first substrate 111 to the insulating interlayer 169 may be referred to as a wiring unit 130.

The protective layer 132 is disposed on the insulating interlayer 169. The protective layer 132 serves to planarize an upper portion of the wiring unit 130. Accordingly, the protective layer 132 is also referred to as a flattening/planarizing layer.

The protective layer 132 may include an inorganic insulating material such as silicon nitride (SiNx) and silicon oxide (SiOx). According to an exemplary embodiment of the present invention, the protective layer 132 may include an organic layer. According to an exemplary embodiment of the present invention, the protective layer 132 may have a dual-layer structure including a lower inorganic layer and an upper organic layer.

The pixel electrode PE is disposed on the protective layer 132. According to an exemplary embodiment of the present invention, the pixel electrode PE is connected to the drain electrode DE through a contact hole CH defined through the protective layer 132 and the insulating interlayer 169. The pixel electrode PE may include a transparent conductive material such as indium tin oxide (ITO) and indium zinc oxide (IZO).

The opposing substrate US includes a second substrate 121, a color filter layer 170, and a common electrode CE. Referring to FIG. 13, the opposing substrate US further includes a light blocking portion BM and a passivation layer 150. The passivation layer 150 may be disposed between the color filter layer 170 and the common electrode CE. The passivation layer 150 may be omitted.

The second substrate 121 may include transparent materials such as glass or plastic.

The light blocking portion BM is disposed on the second substrate 121. The light blocking portion BM has a plurality of openings. The openings correspond to respective pixel electrodes PE of first, second and third pixels PX1, PX2 and PX3. The light blocking portion BM blocks light except for within the openings. For example, the light blocking portion BM is disposed on the TFT, the gate line GL, and the data line DL. The light blocking portion BM blocks light from passing therethrough and directs light outwardly. The light blocking portion BM may be omitted.

The color filter layer 170 is disposed on the second substrate 121 and selectively blocks a wavelength of light incident from a backlight unit.

The color filter layer 170 includes a color filter CF. For example, the color filter layer 170 may include a first color filter CF1, a second color filter CF2, and a third color filter CF3.

The first, second, and third color filters CF1, CF2, and CF3 may be distinguished from each other by the light blocking portion BM. Respective ones of the color filters CF1, CF2, and CF3 may be disposed so as to overlap the pixels PX1, PX2, and PX3. For example, each of the color filters CF1, CF2, and CF3 may be located at the opening of the light blocking portion BM corresponding to the pixel electrode PE.

Each of the color filters CF1, CF2, and CF3 may overlap each other.

Referring to FIG. 13, the first color filter CF1 may correspond to a red pixel PX1, the second color filter CF2 may correspond to a green pixel PX2, and the third color filter CF3 may correspond to a blue pixel PX3. The color filter layer 170 may include a white color filter and may include a color filter having a color other than red, green, and/or blue.

The passivation layer 150 is disposed on the color filter layer 170.

The common electrode CE is disposed on the passivation layer 150. For example, the common electrode CE may be disposed over an entire surface of the second substrate 121. The common electrode CE may include a transparent conductive material such as ITO or IZO.

The common electrode CE, along with the pixel electrode PE, applies an electric field over the liquid crystal layer LC. As a result, an electric field is formed over the liquid crystal layer LC between the common electrode CE and the pixel electrode PE.

A lower alignment layer may be disposed on the pixel electrode PE. The lower alignment layer may be a vertical alignment layer, and may include a photoreactive material. An upper alignment layer may be disposed on the common electrode CE. The upper alignment layer may include a substantially same material as that included in the lower alignment layer.

The surfaces of the first substrate 111 and the second substrate 112 that face each other are defined as upper surfaces of the corresponding substrates and the surfaces on opposite sides of the upper surfaces are respectively defined as lower surfaces of the corresponding substrates. Polarizers may be disposed on the lower surface of the first substrate 111 and the lower surface of the second substrate 112, respectively.

Figure 14:
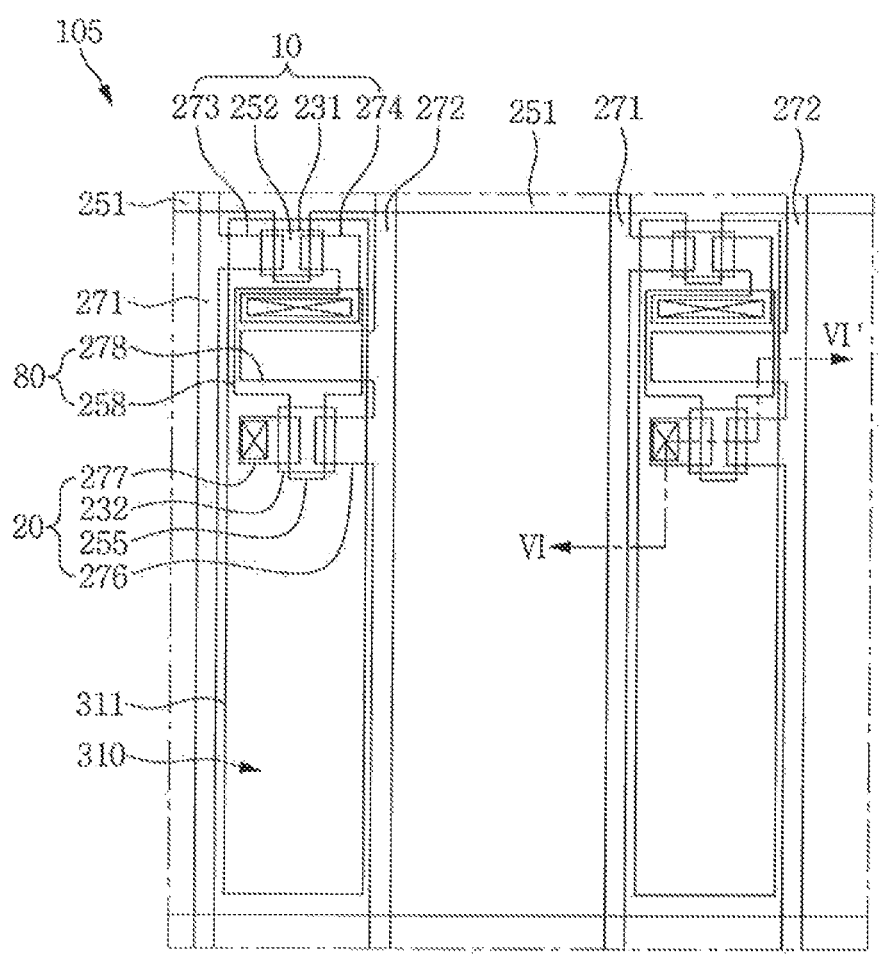
FIG. 14 is a plan view illustrating pixel arrangement of a display panel according to an exemplary embodiment of the present invention.
Figure 15:
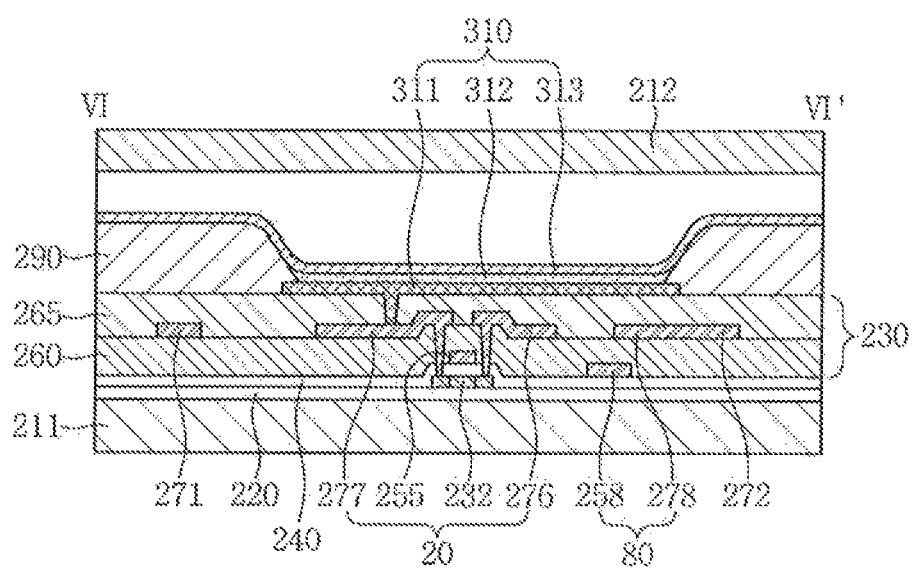
FIG. 15 is a cross-sectional view taken along line VI-VI' of FIG. 14.

FIG. 14 is a plan view illustrating pixel arrangement of a display panel according to an exemplary embodiment of the present invention, and FIG. 15 is a cross-sectional view taken along line VI-VI' of FIG. 14.

For example, the display panel illustrated in FIGS. 14 and 15 is an OLED display panel 105. The OLED display panel 105 includes a first substrate 211, a driving circuit unit 230, and an OLED 310.

The first substrate 211 may include an insulating material such as glass, quartz, ceramic, plastic, and/or the like. In an exemplary embodiment of the present invention, a polymer film may be used as the first substrate 211.

A buffer layer 220 is disposed on the first substrate 211. The buffer layer 220 may include one or more layers that may include inorganic layers and/or organic layers. The buffer layer 220 may be omitted.

The driving circuit unit 230 is disposed on the buffer layer 220. The driving circuit unit 230 includes a plurality of TFTs 10 and 20 and drives the OLED 310. For example, the OLED 310 may emit light according to a driving signal applied from the driving circuit unit 230, such that an image may be displayed.

FIGS. 14 and 15 illustrate an active matrix-type organic light emitting diode (AMOLED) display device 105 having a two-transistor, one capacitor ("2Tr-1Cap") structure. For example, the 2Tr-1Cap structure may include two TFTs, e.g., a switching TFT 10 and a driving TFT 20, and one capacitor 80 in each pixel. However, exemplary embodiments of the present invention are not limited thereto. For example, the OLED display device 105 may include three or more TFTs and two or more capacitors in each pixel, and may further include additional wirings. Herein, the term "pixel" refers to a smallest unit for displaying an image, and the OLED display device 105 displays an image using a plurality of pixels.

Each pixel PX includes the switching TFT 10, the driving TFT 20, the capacitor 80, and the OLED 310. In addition, a gate line 251 extending along one direction, and a data line 271 and a common power line 272 insulated from and intersecting the gate line 251 are also disposed at the driving circuit unit 230. Each pixel PX may be defined by the gate line 251, the data line 271, and the common power line 272 as a boundary, but exemplary embodiments of the present invention are not limited thereto. The pixels PX may be defined by a pixel defining layer 290 or a black matrix.

The OLED 310 includes a first electrode 311, an organic light emitting layer 312 disposed on the first electrode 311, and a second electrode 313 disposed on the organic light emitting layer 312. The organic light emitting layer 312 includes a low molecular organic material or a high molecular organic material. Holes and electrons are injected into the organic light emitting layer 312 from the first electrode 311 and the second electrode 313, respectively, and combined therein to form an exciton. The OLED 310 emits light when the exciton falls from an excited state to a ground state.

The capacitor 80 includes a pair of capacitor plates 258 and 278, having an insulating interlayer 260 interposed therebetween. In such an exemplary embodiment of the present invention, the insulating interlayer 260 may be a dielectric element. A capacitance of the capacitor 80 is determined by electric charges accumulated in the capacitor 80 and a voltage across the pair of capacitor plates 258 and 278.

The switching TFT 10 includes a switching semiconductor layer 231, a switching gate electrode 252, a switching source electrode 273, and a switching drain electrode 274. The driving TFT 20 includes a driving semiconductor layer 232, a driving gate electrode 255, a driving source electrode 276, and a driving drain electrode 277. A gate insulating layer 240 is further disposed to insulate the semiconductor layers 231 and 232 and the gate electrodes 252 and 255.

The switching TFT 10 may function as a switching element which selects a pixel to perform light emission. The switching gate electrode 252 is connected to the gate line 251, and the switching source electrode 273 is connected to the data line 271. Spaced apart from the switching source electrode 273, the switching drain electrode 274 is connected to one of the capacitor plates, e.g., the capacitor plate 258 and is spaced apart from the switching source electrode 273.

The driving TFT 20 applies a driving power to the first electrode 311 which is a pixel electrode PE. By applying the driving power, the organic light emitting layer 312 may emit light within the selected pixel. The driving gate electrode 255 is connected to the capacitor plate 258 that is connected to the switching drain electrode 274. Each of the driving source electrode 276 and the other of the capacitor plates, e.g., the capacitor plate 278, is connected to the common power line 272. The driving drain electrode 277 is connected to the first electrode 311 of the OLED 310 through a contact hole defined in a planarization layer 265.

With the above-described structure, the switching TFT 10 is operated based on a gate voltage applied to the gate line 251. The switching TFT 10 serves to transmit a data voltage applied to the data line 271 to the driving TFT 20. A voltage equivalent to a difference between a common voltage applied to the driving TFT 20 from the common power line 272 and the data voltage transmitted by (or from) the switching TFT 10 is stored in the capacitor 80. A current corresponding to the voltage stored in the capacitor 80 flows to the OLED 310 through the driving TFT 20 such that the OLED 310 may emit light.

The first electrode 311 may be a transmissive electrode having light transmittance or a reflective electrode having light reflectivity. The second electrode 313 may include a semi-transmissive layer or a reflective layer.

Referring to FIG. 15, the first electrode 311 is a reflective electrode and the second electrode 313 is a semi-transmissive electrode. Light generated in the organic light emitting layer 312 is emitted through the second electrode 313. However, exemplary embodiments of the present invention are not limited thereto. For example, the first electrode 311 may be a light transmissive electrode, the second electrode 313 may be a reflective electrode, and light generated in the organic light emitting layer 312 may be emitted through the first electrode 311.

A hole injection layer HIL and/or a hole transporting layer HTL may further be disposed between the first electrode 311 and the organic light emitting layer 312. An electron transporting layer ETL and/or an electron injection layer EIL may further be disposed between the organic light emitting layer 312 and the second electrode 313. The organic light emitting layer 312, the hole injection layer HIL, the hole transporting layer HTL, the electron transporting layer ETL, and the electron injection layer EIL may each include an organic material, and thus may be referred to as an organic layer.

The pixel defining layer 290 has an aperture. The aperture of the pixel defining layer 290 exposes a portion of the first electrode 311. The organic light emitting layer 312 and the second electrode 313 are sequentially stacked on the first electrode 311 at the aperture of the pixel defining layer 290. In such an exemplary embodiment of the present invention, the second electrode 213 may also be formed on the pixel defining layer 290 as well as on the organic light emitting layer 312. In addition, the HIL, the HTL, the ETL, and the EIL may also be disposed between the pixel defining layer 290 and the second electrode 313. The OLED 310 emits light from the organic light emitting layer 312 in the aperture of the pixel defining layer 290. As such, the pixel defining layer 290 may define a light emission area.

A capping layer may be disposed on the second electrode 313 to protect the OLED 310 from the external environment.

A second substrate 212 is disposed on the second electrode 313. The second substrate 212, along with the first substrate 211, serves to seal the OLED 310. The second substrate 212, similar to the first substrate 211, may include an insulating material such as glass, quartz, ceramic, plastic, and/or the like.

Figure 16:
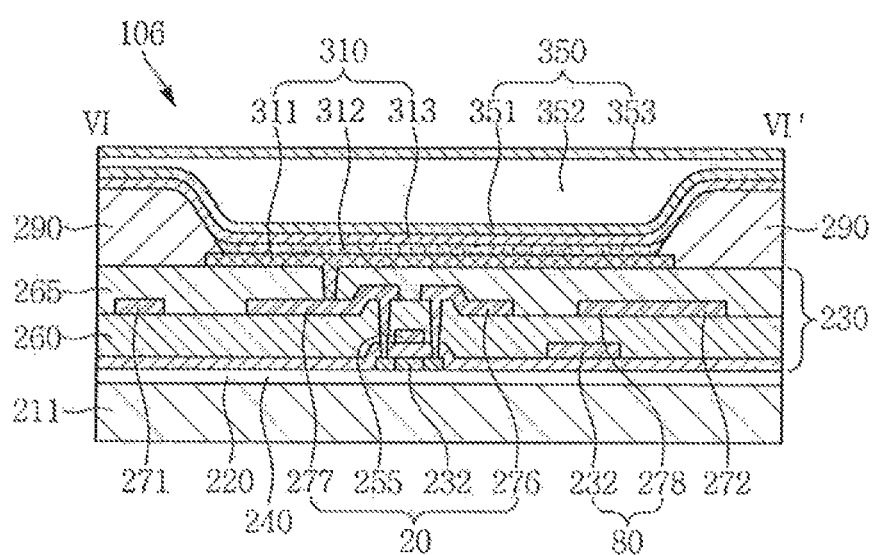
FIG. 16 is a cross-sectional view illustrating a display panel according to an exemplary embodiment of the present invention.

FIG. 16 is a cross-sectional view illustrating a display panel according to an exemplary embodiment of the present invention. The display panel illustrated in FIG. 16 is an OLED display panel 106.

The OLED display panel 106 illustrated in FIG. 16 includes a thin film encapsulation layer 350 that is disposed on a second electrode 313 to protect an OLED 310.

The thin film encapsulation layer 350 includes one or more inorganic layers 351 and 353 and at least one organic layer 352. These inorganic/organic layers 351, 352, 353 may prevent outside air, such as moisture or oxygen, from permeating into the OLED 310.

The thin film encapsulation layer 350 may have a structure in which the inorganic layers 351 and 353 and the organic layer 352 are alternately stacked. In FIG. 16, the thin film encapsulation layer 350 includes two inorganic layers 351 and 353 and one organic layer 352, but the structure of the thin film encapsulation layer 350 is not limited thereto.

Each of the inorganic layers 351 and 353 may include $Al_2O_3$, $TiO_2$, ZrO, $SiO_2$, AlON, AlN, SiON, $Si_3N_4$, ZnO, and/or $Ta_2O_5$. The inorganic layers 351 and 353 may be formed through methods such as a chemical vapor deposition (CVD) method or an atomic layer deposition (ALD) method. However, exemplary embodiments of the present invention are not limited thereto, and the inorganic layers 351 and 353 may be formed using various methods known to those skilled in the art.

The organic layer 352 may include a polymer-based material. The polymer-based material may include, for example, an acrylic resin, an epoxy resin, polyimide, and/or polyethylene. In addition, the organic layer 352 may be formed through a thermal deposition process. The thermal deposition process for forming the organic layer 352 may be performed in a temperature range that might not damage the OLED 310. However, exemplary embodiments are not limited thereto, and the organic layer 352 may be formed using various other methods known to those skilled in the pertinent art.

The inorganic layers 351 and 353 may have a high density and may prevent or efficiently reduce infiltration of contaminants such as moisture or oxygen. Infiltration of moisture and oxygen into the OLED 310 may be largely prevented by the inorganic layers 351 and 353, even though the inorganic layers 351 and 353 may be formed as thin films.

Moisture and oxygen that have passed through the inorganic layers 351 and 353 may further be blocked by the organic layer 352. The organic layer 352 may have relatively low moisture-infiltration preventing efficacy, as compared to the inorganic layers 351 and 353. However, the organic layer 352 may also serve as a buffer layer to reduce stress among respective ones of the inorganic layers 351 and 353 and the organic layer 352, in addition to the moisture-infiltration preventing function. Further, since the organic layer 352 has planarization characteristics, an uppermost surface of the thin film encapsulation layer 350 may be planarized by the organic layer 352.

The thin film encapsulation layer 350 may have a thickness of about 10 μm or less. Accordingly, the OLED display device 106 may also be relatively thin. By applying the thin film encapsulation layer 350 in such a manner, the OLED display device 106 may be flexible.

In the case where the second substrate 212 is omitted and a flexible substrate is used as the first substrate 211, the OLED display panel 106 may be used in a flexible display device.

As set forth herein, in one or more exemplary embodiments of the present invention, the display device has an ultrasonic wave transmission area for confirming whether or not an adhesive layer is cured. Accordingly, curing of the adhesive layer may be confirmed by radiating ultrasonic waves through the ultrasonic wave transmission area.

From the foregoing, it will be appreciated that various exemplary embodiments, in accordance with the present disclosure, have been described herein for purposes of illustration, and that various modifications may be made without departing from the scope and spirit of the present teachings. Accordingly, the various embodiments disclosed herein are not intended to be limiting of the true scope and spirit of the present teachings. Various features of the above described and other exemplary embodiments may be mixed and matched in any manner, to produce further exemplary embodiments consistent with the invention.

What is claimed is:

1. A display device comprising:
  a display panel having a display area and a non-display area;
  a window disposed on the display panel;
  a bezel portion disposed on the window, the bezel portion at least partially overlapping the non-display area; and
  an adhesive layer disposed between the display panel and the window,
  wherein the display panel comprises:
    a first substrate; and
    a wiring unit comprising a plurality of wirings disposed on the first substrate,
    wherein the wiring unit has a wide gap portion defined by two neighboring wirings,
  wherein the two neighboring wirings comprises:
    a first wiring extending in a first direction; and
    a second wiring extending in the first direction and adjacent to the first wiring, wherein the first wiring comprises:
      a first portion;
      a second portion; and
      a third portion connected to and between the first and second portion,
  wherein the second wiring comprises:
    a fourth portion overlapping with the first portion in a second direction perpendicular to the first direction;
    a fifth portion overlapping with the second portion in the second direction; and
    a sixth portion connected to and between the fourth and fifth portion and overlapping with the third portion in the second direction,
  wherein a distance in the second direction between the third and sixth portions defining the wide gap portion is greater than a distance in the second direction between the first and forth portions and a distance in the second direction between the second and fifth portions, and
  wherein the wide gap portion at least partially overlaps the bezel portion.

2. The display device as claimed, in claim 1, wherein the wide gap portion is an ultrasound inspection area.

3. The display device as claimed in claim 1, wherein the distance in the second direction between the third and sixth portions is in a range of about 100 μm to about 300 μm.

4. The display device as claimed in claim 1, wherein the wide gap portion does not overlap a conductor in a space between the first substrate and the adhesive layer.

5. The display device as claimed in claim 1, further comprising a touch panel disposed between the window and the adhesive layer.

6. The display device as claimed in claim 1, further comprising a metal layer disposed between the bezel portion and the adhesive layer, the metal layer comprising a metal.

7. The display device as claimed in claim 1, wherein wide gap portion further comprises one or more additional neighboring wirings that are curved away from the two neighboring wirings.

8. The display device as claimed in claim 7, wherein the one or more additional neighboring wirings includes three wirings on a first side of the two neighboring wirings and three wirings on a second side of the two neighboring wirings, each curved away from the two neighboring wirings.

9. The display device as claimed in claim 7, wherein in the wide gap portion, the two neighboring wirings curve away from one another in a plan view to form a substantially circular space therebetween.

* * * * *